United States Patent
Tehrani et al.

(10) Patent No.: US 12,465,250 B2
(45) Date of Patent: Nov. 11, 2025

(54) WEARABLE BIOSENSOR DEVICE WITH IMPROVED MICRONEEDLE ARRAY PLACEMENT

(71) Applicant: AQUILX INCORPORATED, Bonsall, CA (US)

(72) Inventors: Farshad Tehrani, Bonsall, CA (US); Hazhir Teymourian, San Diego, CA (US)

(73) Assignee: AQUILX INCORPORATED, Bonsall, CA (US)

( * ) Notice: Subject to any disclaimer, the term of this patent is extended or adjusted under 35 U.S.C. 154(b) by 0 days.

(21) Appl. No.: 18/528,763

(22) Filed: Dec. 4, 2023

(65) Prior Publication Data

US 2025/0025077 A1    Jan. 23, 2025

Related U.S. Application Data

(60) Provisional application No. 63/429,866, filed on Dec. 2, 2022.

(51) Int. Cl.
*A61B 5/1473*    (2006.01)

(52) U.S. Cl.
CPC ............................... *A61B 5/1473* (2013.01)

(58) Field of Classification Search
CPC .................................................... A61B 5/1473
See application file for complete search history.

(56) References Cited

U.S. PATENT DOCUMENTS

2020/0008299 A1 * 1/2020 Tran .................... H05K 1/0386
2023/0012662 A1 * 1/2023 Tehrani ............. A61B 5/14503

* cited by examiner

*Primary Examiner* — Alex M Valvis
*Assistant Examiner* — Grace L Rozanski
(74) *Attorney, Agent, or Firm* — Joseph S. Bird; C. Brandon Browning; Maynard Nexsen PC

(57) ABSTRACT

A biowearable sensor device is disclosed with improved features in the microneedle array and the electronics unit which, without limitation, reduce damage to the microneedles from excessive force which can occurring during placement, and verify proper placement of the microneedle tips in a biofluid in the skin layers of the wearer, both during placement and the entire life of the device.

17 Claims, 11 Drawing Sheets

WEARABLE BIOSENSOR DEVICE WITH IMPROVED MICRONEEDLE ARRAY PLACEMENT

STATEMENT REGARDING PRIORITY AND RELATED APPLICATIONS

This application claims priority and the full benefit of U.S. provisional patent application No. 63/429,866 filed Dec. 2, 2022. This application incorporates by reference PCT/US22/36424 and U.S. Pat. No. 11,684,298 issued Jun. 17, 2023 (together, "the '298 patent"), as if set forth fully herein.

GOVERNMENT LICENSE RIGHTS

This invention was made with US government support under Grant Number: 5R44AA030231-03 awarded by the National Institute on Alcohol Abuse and Alcoholism. The US government has certain rights in the invention.

ASPECTS OF THE INVENTION

The present invention is a wearable biosensor device system in one aspect for reliably and repeatably inserting submillimeter microneedles in a microneedle array in a wearable biosensor into the outermost layer of the skin—the epidermis—to facilitate accurate biomolecular monitoring in a biofluid such as interstitial fluid (ISF), blood and cerebrospinal fluid. The invention enables better placement of the microneedle array with a force touch sensor and feedback indicator which guide the user in applying an adequate amount of pressure (force) onto a device composed of microneedles to ensure proper insertion and provides real-time feedback. Placement includes not only the initial placement of the device but also a continuous monitoring that correct placement has been maintained throughout the life of the wearable biosensor device. The system also includes a bioelectronic measurement component which compares electrical signals for the microneedles to notify the wearer that the microneedles have reached a biofluid in the body. The feedback can be in different ways through, for example, vibrations, sounds, flashing lights on the wearable device and notification through Bluetooth or similar signals to a mobile device containing an app.

The microneedle array may include a group of microneedles to detect a first analyte, a second group of microneedles to detect a second analyte, and a third portion of microneedles to detect a third analyte. The microneedle array may be configured to detect any suitable number of analytes (e.g., 1, 2, 3, 4, 5 or more, etc.). Suitable target analytes for detection are selected from the group consisting of glucose, ketones, lactate, and alcohol.

Figure 1A:
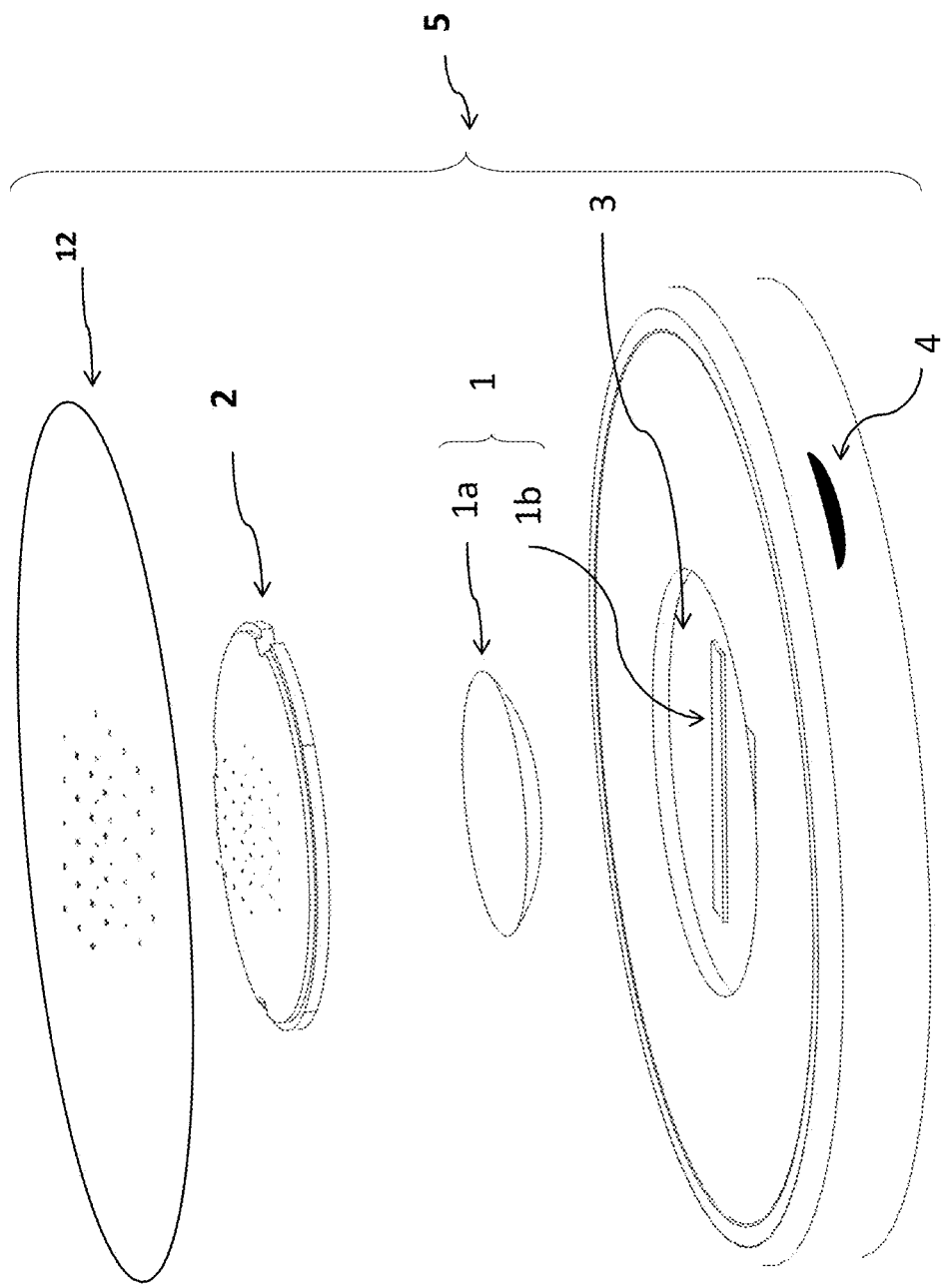
FIG. 1a is an exploded view of the wearable biosensor device with polymer microneedle array and cover unit.

Disclosed is wearable biosensor device which comprises a microneedle array having a substrate with microneedles disposed on the substrate, wherein at least one of the microneedles is configured as a working electrode to detect an electrical signal from a reaction with a target analyte exposed to the microneedle array in a biofluid of a body of a wearer, and the working electrode is functionalized with at least one chemical layer positioned on at least one of the microneedles and is configured for producing an electrical signal from a reaction with the target analyte; an electronics unit underneath the substrate connected to the microneedles by a plurality of electrical interconnections; a force touch sensor configured to measure force applied during placement or anytime during the life of the device of the microneedle array into skin of a user, the force touch sensor connected electrically to the electronics unit; a placement validation system connected electrically to the electronics unit and configured to detect a change in conditions using bioelectronic measurement among microneedles outside the body and in a biofluid, and a feedback indicator connected electrically to the electronics unit and configured to provide to the wearer a notification of excessive force in placement and/or of proper placement in the biofluid. The electronics unit comprises a data processing unit in communication with a signal processing circuit, the data processing unit comprising a processor and a memory and configured to process the electrical signal as data representative of one or more parameters of the target analyte, and the signal processing circuit is configured to process the electrical signal by one or more of amplifying the electrical signal, filtering the electrical signal, or converting the electrical signal from analog to digital, and the data processing unit is configured to process the electrical signal after processing by the signal processing circuit. The electronics unit further comprises a wireless communication unit in communication with one or both of the signal processing circuit and the data processing unit, the wireless communication unit comprising a wireless transmitter or wireless transceiver to at least transmit one or both of the electrical signal and the data to an external computing device.

The at least one chemical layer comprises a material selected may be from the group consisting of an enzyme, an ionophore, an antibody, a peptide nucleic acid (PNA), a DNA aptamer, a RNA aptamer, a molecularly imprinted polymer (MIP), and a cell. The microneedles of the wearable biosensor may be targeted for a single analyte in the biofluid, or may be separated into groups which are electrically segregated, and the chemical layer for each of the groups is different to a unique analyte.

The force touch sensor may be selected from the group consisting of pressure, strain gauge, piezoelectric, piezoresistive, resonant, electromagnetic, capacitive, and diaphragm-based MEMS sensors operating individually or in combination with each other, and the force touch sensor is configured to transduce an applied force into an electrical parameter selected from the group consisting of resistance, current, capacitance, inductance, frequency or phase shift, voltage variability, optical or thermal changes and magnetic field variations.

The placement validation system can comprises a single or multiplexed two-, three- or four-electrode electrochemical system comprising the microneedles, and the bioelectronic measurement system is configured to use electrochemical techniques selected from the group consisting of impedance spectroscopy, voltammetry, potentiometry and amperometry.

The feedback indicator comprises a physical or virtual device configured to generate a notification selected from the group consisting of a microelectromechanical system (MEMS) speaker, a vibration actuator, and a light-emitting diode (LED) on the wearable device and a notification through Bluetooth or similar signals to a mobile device containing an app.

The vibration actuator is selected from the group consisting of an eccentric rotating mass actuator (ERM), a linear resonant actuator (LRA), a piezoelectric actuator, electroactive polymers (EAPs), microelectromechanical systems (MEMS), a tactile haptic-based oscillation/resonance actuator and a voice coil actuator. The driving signal of the vibration actuator is selected from the group consisting of amplitude, frequency and on/off keying.

The notification to the wearer is selected from the group of a sound, a light, a vibration or a message delivered to the app on the mobile device.

The force touch sensor can also configured as a switch to turn the device on or off.

The improved aspects for placement are configured in a device with a microneedle array comprising a nonconductive polymer coated with an electrically conductive layer and positioned underneath the chemical layer, or a microneedle array comprising a semiconductor material having various material layers applied and shaped using microelectromechanical systems (MEMS). In one embodiment of the invention, a force touch sensor is integrated into a wearable biosensor device such as those in the '298 patent and is connected to a printed circuit board (PCB), underneath the microneedle array and substrate, translating the forces among the microneedles and the skin to a measurable signal. The force touch sensor in different embodiments is selected from the group consisting of pressure, strain gauge, piezoelectric, piezoresistive, resonant, electromagnetic, capacitive, and diaphragm-based MEMS sensors operating individually or in combination with each other.

In various embodiments, the feedback indicator is also integrated into the microneedle sensor device electrically connected to the PCB. In another embodiment the feedback indicator can be mounted to the microneedle array and have electrical connections to the PCB. It can also be mounted to an enclosure and electrically connected to the PCB or to an ASIC with all the PCB-type components. Embodiments of the feedback indicator comprise devices selected from the group consisting of a microelectromechanical system (MEMS) speaker, a vibration actuator, and a light-emitting diode (LED).

Figure 1B:
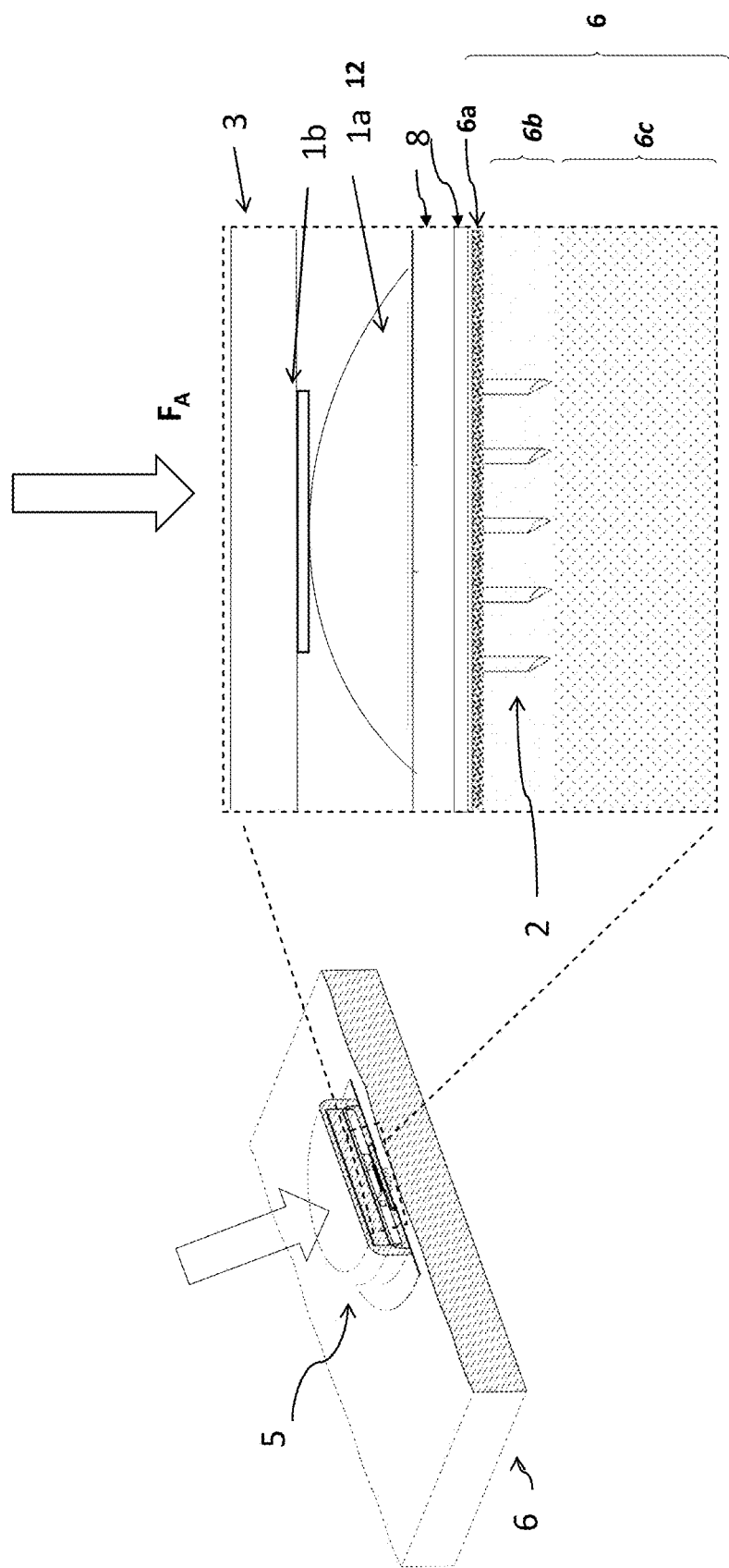
FIG. 1b is a section view of the wearable biosensor device with the microneedle array placed in the skin, and a closeup, showing a two component pressure gauge as the force touch sensor.

Interplay between the force touch sensor and feedback indicator and the "mode" of user interaction can be realized in various ways. The following describes an exemplary operation mode for the feedback and implementation in the wearable biosensor device 12 as disclosed in the '298 patent (without some features disclosed therein) but as improved in the present invention. As shown in the embodiment in FIG. 1a and FIG. 1b, the force touch sensor 1 is a two component resistance-based pressure sensor 1a placed behind the microneedle array 2 (i.e., opposite the top of the microneedle array tips), with the complementary conductive trace 1b behind the PCB or ASIC. FIG. 1a is an exploded view of the wearable biosensor 12 with a pressure sensor under the microneedle array 2 in two parts, an elastic conductive pad 1a and a conductive trace 1b, which is connected electrically to the electronics unit 3, here a PCB. (As used herein, the electronics unit can be a PCB and/or an Application Specific Integrated Circuit (ASIC), and the latter terms can be used interchangeably herein.) In this embodiment, a feedback indicator 4 (here a micro speaker) is located on the outside of the biosensor device. FIG. 1b is a cross-sectional view of the sensor 5 on the skin 6 with the user pressing the wearable sensor (shown Left in cross-section). Pressure sensor components 1a, 1b are underneath the device substrate 8, the microneedle array 2, the cover unit 12, the stratum corneum (skin's dead keratinocytes) 6a and the epidermis 6b and dermis layers 6c underneath it (Right). Arrows FA show the direction of force.

Figure 1C:
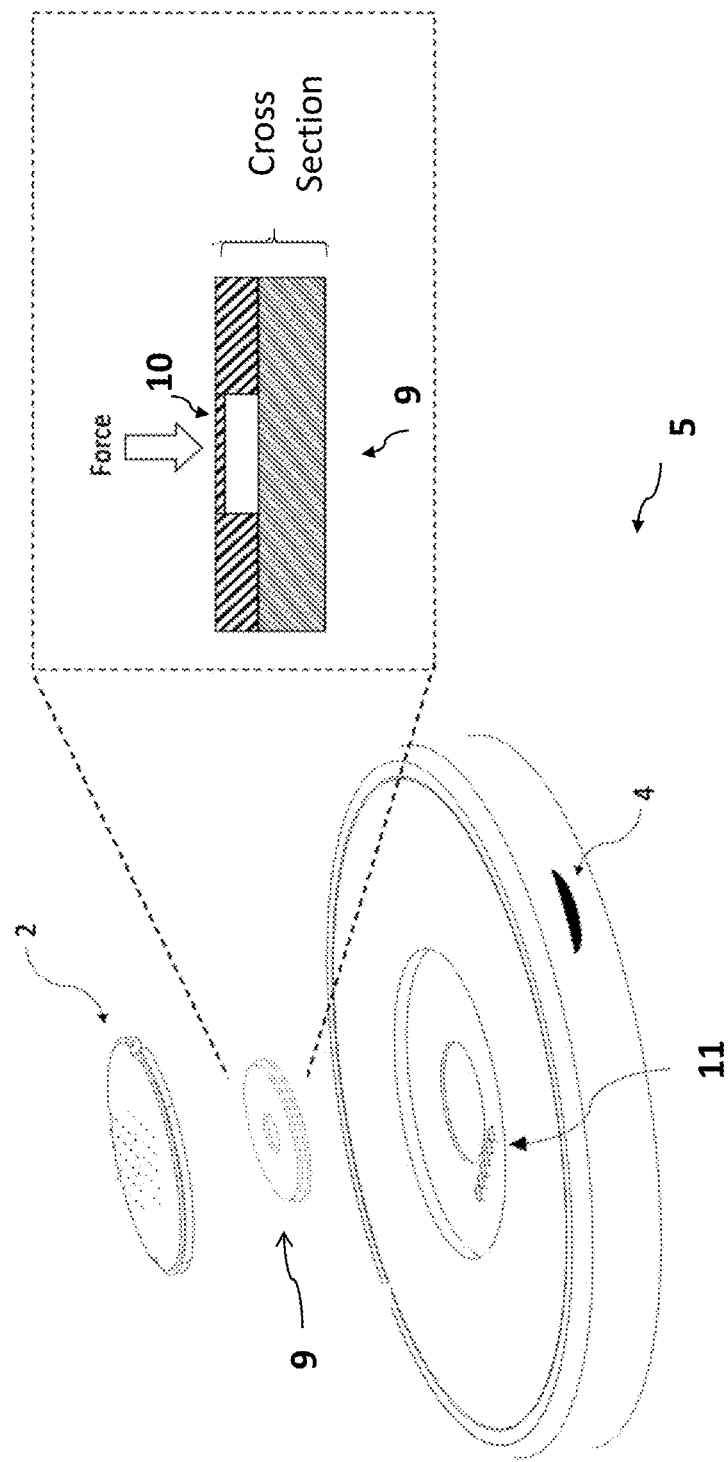
FIG. 1c is an exploded view of the microarray as a MEMS structure with a pressure sensor comprising a MEMS diaphragm.

FIG. 1c shows a further embodiment of the present invention, a Micro-Electro-Mechanical Systems (MEMS) pressure sensor 9 (e.g., capacitive pressure sensor). The microneedle array 2 may be at least partially formed from a semiconductor (e.g., silicon) substrate and include various material layers applied and shaped using various suitable microelectromechanical systems (MEMS) manufacturing techniques (e.g., deposition and etching techniques) known in the art. Suitable configurations for the MEMS device described herein are found in US patent publication number US20220031209A1. The MEMS pressure sensor is situated to maximize its operational efficacy, either positioned directly behind the microneedle array 2 (which can be of MEMS construction) or in conjunction with the signal processing unit, such as a PCB or an ASIC. The MEMS pressure sensor 9 in this embodiment is distinguished by a diaphragm 10 crafted from silicon or a similarly behaving material. This diaphragm, shown in the callout to the right, is meticulously calibrated to deform within a specific pressure range, precisely from 1 Newton (N) to 50 Newtons (N). The design ensures that the sensitivity of the diaphragm is finely tuned, inversely correlating with its dimensional proportions. Upon application of the microneedle array to a patient's skin, and subsequent exertion of pressure, the MEMS pressure sensor 9 is activated. The diaphragm 10 deforms responsively, influencing the piezoresistive elements that are integrally embedded within it. These elements, highly sensitive to deformation, undergo a change in electrical resistance that directly corresponds to the magnitude of the applied pressure. This change is accurately captured and processed by the embedded electrical circuitry, such as the Wheatstone bridge network, described further herein, which is specifically configured to amplify and refine the signal for enhanced precision. The Wheatstone bridge, a fundamental circuit in pressure sensing applications, is adept at precisely measuring minute changes in resistance, making it ideal for translating the mechanical deformations of the diaphragm into reliable electrical signals. Subsequently, the processed signal is transmitted to the signal processing unit, where it undergoes a transformation from an analog to a digital format.

Figure 2:
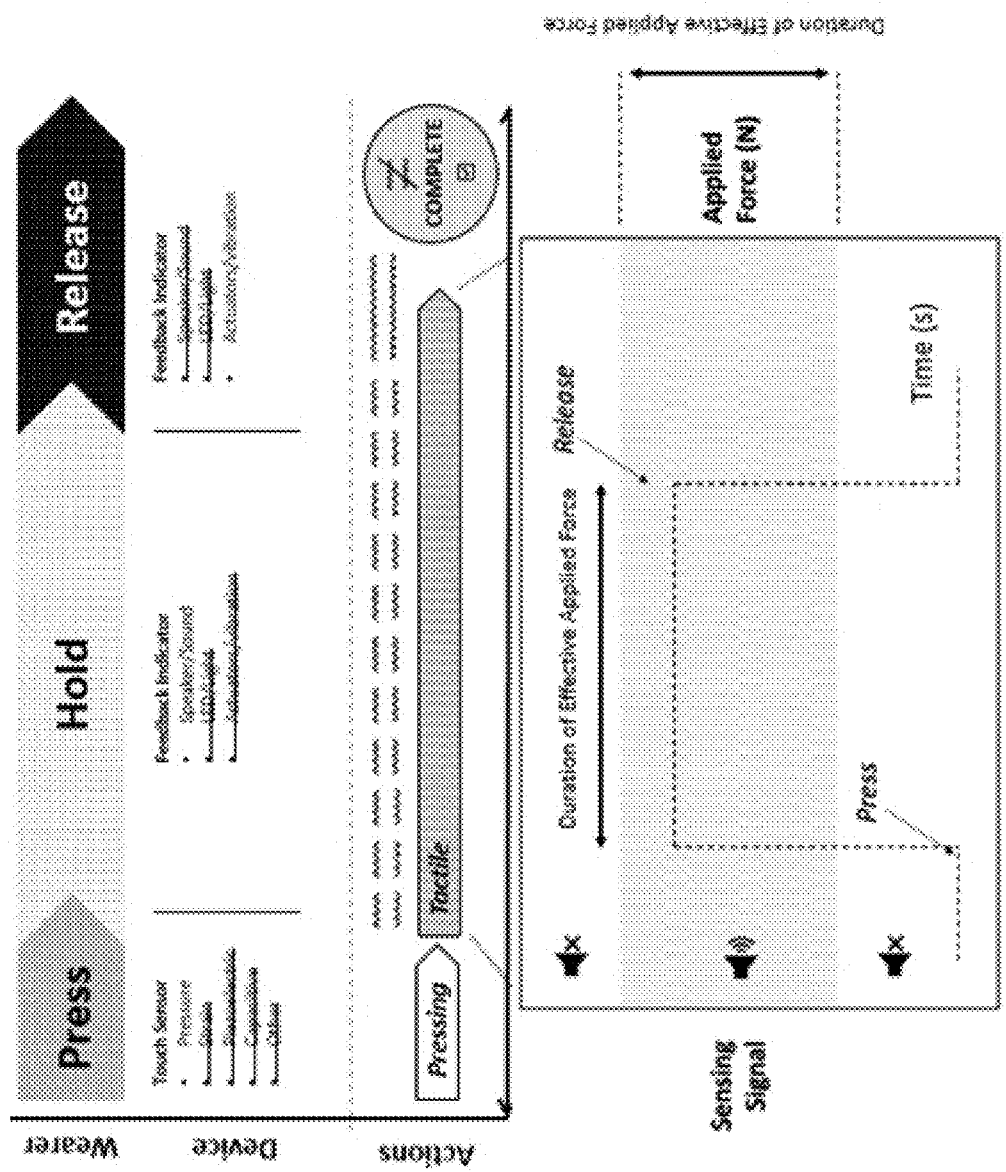
FIG. 2 is a diagram of basic mode of press/hold/release phases with the corresponding exemplary graph of a pressure sensor and duration and magnitude of the applied force using a pressure sensor as the force touch sensor, and a speaker emitting a sound such as a beep.

FIG. 2 depicts one embodiment of the force touch sensor 1 of the device. The diagram shows a basic mode of press/hold/release phases with the corresponding exemplary graph of a pressure sensor and duration and magnitude of the applied force using a pressure sensor as the force touch sensor, and a speaker emitting a sound such as a beep. Crossed-out text represents other embodiments to create better placement using different touch sensors and feedback indicators which can operate simultaneously or individually. FIG. 2 depicts the feedback indicator 4 in an embodiment as a micro speaker. Here, the user applies the sensor 5 to her skin and presses the back end of the device (with the microneedle tips facing the skin). Upon applying the pressure, the micro speaker begins providing feedback in the form of beeping to guide the applied pressure in magnitude and duration. In one embodiment, a 0.5 second on/0.5 second off beeping regime occurs when the user applies a "correct" magnitude of force to the device and continues for 6 seconds to guide the duration, after which a continuous beep (a single tone for 3 seconds followed by muting) is emitted to indicate that the microneedles have been inserted correctly and the application process is complete. In one embodiment, a correct magnitude of force is within a range of 5-50 newtons and in another embodiment 15-35 newtons. Pauses in beeping can indicate insufficient magnitude and therefore the need to reposition the device. All beeping (or any other feedback) occurs in real-time.

Figure 3:
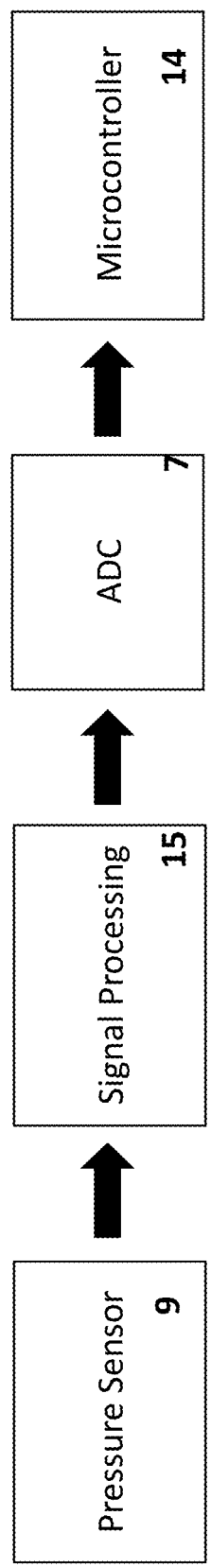
FIG. 3 is functional block diagram for the force touch sensor data measurement.

A functional block diagram for the force touch sensor data measurement is depicted in FIG. 3, which in one embodiment comprises a force touch (pressure) sensor 1, signal processing circuitry 15, an analog-to-digital converter (ADC) 7, and a microcontroller 14.

In another embodiment, the signal processing circuitry may provide electrical biasing to the force touch sensor for proper operation.

In one embodiment, the force touch sensor can be used as a switch to turn the entire sensor on or off, where the two separate conductive elements usually resulting in a change in resistance or a closed circuit signals a button being pressed.

In yet another embodiment, the signal processing circuitry may provide signal conversion (e.g., transimpedance or current-to-voltage conversion), signal filtering (e.g., pass-band filter), and/or signal amplification to condition the signal for acquisition (i.e., quantization or digitization) by the analog-to-digital (ADC) converter with a high signal-to-noise ratio.

In other embodiments, the ADC may have a single-ended input or a differential input.

In some embodiments, an analog multiplexor may be used at the input of the ADC to utilize the ADC for acquiring multiple signals.

The microcontroller may be used to interpret the electrical signals coming from the output of ADC with suitable algorithms or mathematical equations/transformations (e.g., convert a raw quantized bit-stream into an integer value representative of the acquired signal).

Additional digital signal processing circuitry may be utilized after the digitization of acquired data through digital circuits (e.g., a cascaded integrator-comb (CIC) filter) to improve the signal-to-noise ratio.

Figure 4:
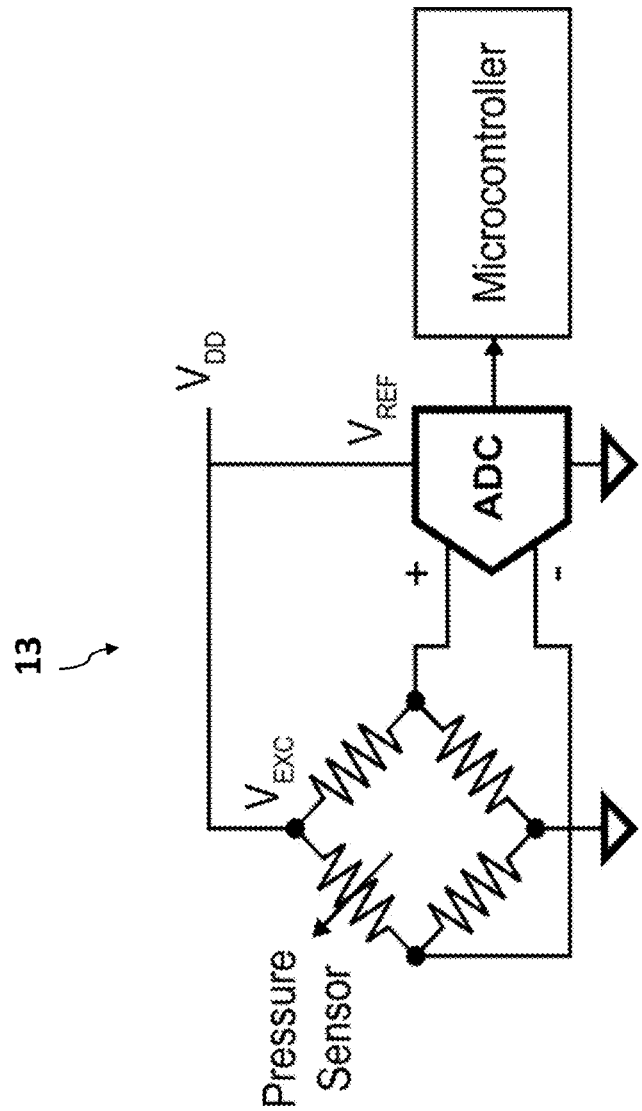
FIG. 4 is a diagram of one embodiment of a circuit implementation of the force touch sensor data measurement capability.

One embodiment of the circuit implementation of the force touch sensor data measurement capability is depicted in FIG. 4. Here, the force touch sensor 1 is represented as a sensor whose resistance is sensitive to applied force, such as a force sensing resistor (FSR), which exhibits a decrease in presented resistance in response to increase in applied force. A Wheatstone Bridge circuit 13 is employed to convert a resistance change into a voltage change, which can then be acquired (quantized/digitized) by the analog-to-digital converter (ADC). The supply voltage, $V_{DD}$, is used as both the excitation voltage ($V_{EXC}$) for the Wheatstone bridge and the ADC reference voltage ($V_{REF}$), which keeps the Wheatstone bridge common-mode voltage output always within the common-mode input range of the ADC. In certain embodiments, power to the Wheatstone Bridge and the ADC can be duty cycled to limit power consumption. In this embodiment, the differential output of the Wheatstone bridge is measured by a differential ADC. The ADC quantizes this differential voltage and provides a bit stream of quantized data to the microcontroller through a digital bus. The microcontroller performs a mathematical transformation on the bit-stream and converts it into an integer value of the applied force.

A schematic of one embodiment of a skin-insertion force reduction capability herein utilizes a force touch sensor and a vibration actuator in order to translate force applied by the user into electronically-controlled vibration of the microneedle electrode(s) to lower the minimum force required for reliable/repeatable microneedle electrode insertion into the epidermis. Minimizing force applied to the skin 1) localizes and minimizes damage to the surrounding skin tissue, 2) minimizes local inflammatory response and resultant biofouling, and 3) improves short-term response (reduced "warm-up" period duration) and 4) improves the long-term stability of the sensor within the skin.

The force touch sensor can be integrated into the microneedle array and/or the electronics unit (e.g., PCB) and can be placed behind the microneedle base (opposite the microneedle tips) with a conductive complementary trace behind the PCB. Additionally the force touch sensor is electrically connected to the PCB. Other embodiments include implementing this on the microneedle array itself, on the enclosure of the microneedle array, all on a single ASIC chip, or all in the PCB as a electronic component.

The force touch sensor can be strain, piezoelectric, or capacitive in nature (among other types described herein) which transduces an applied force into an electrical parameter selected from the group consisting of resistance, impedance, potential, current, capacitance, inductance, frequency or phase shift, voltage variability, optical or thermal changes and magnetic field variations.

The feedback indicator, e.g., vibration actuator, can be electrically connected to the electronics unit such as a PCB. The microneedle array and PCB can also be mechanically integrated with the device housing. This allows the vibration actuator, when mechanically bonded to the PCB, to be mechanically coupled to the microneedle array. In various embodiments, force applied onto the force touch sensor can modulate the vibration actuator driving signal, therefore modulating vibration characteristics. The driving signal of the vibration actuator is selected from the group consisting of amplitude, frequency, and on/off keying. A combination of these types can also be used. The force touch sensor output can be filtered such that there is no feedback interference caused by vibration actuator while acquiring force-touch data.

Figure 5:
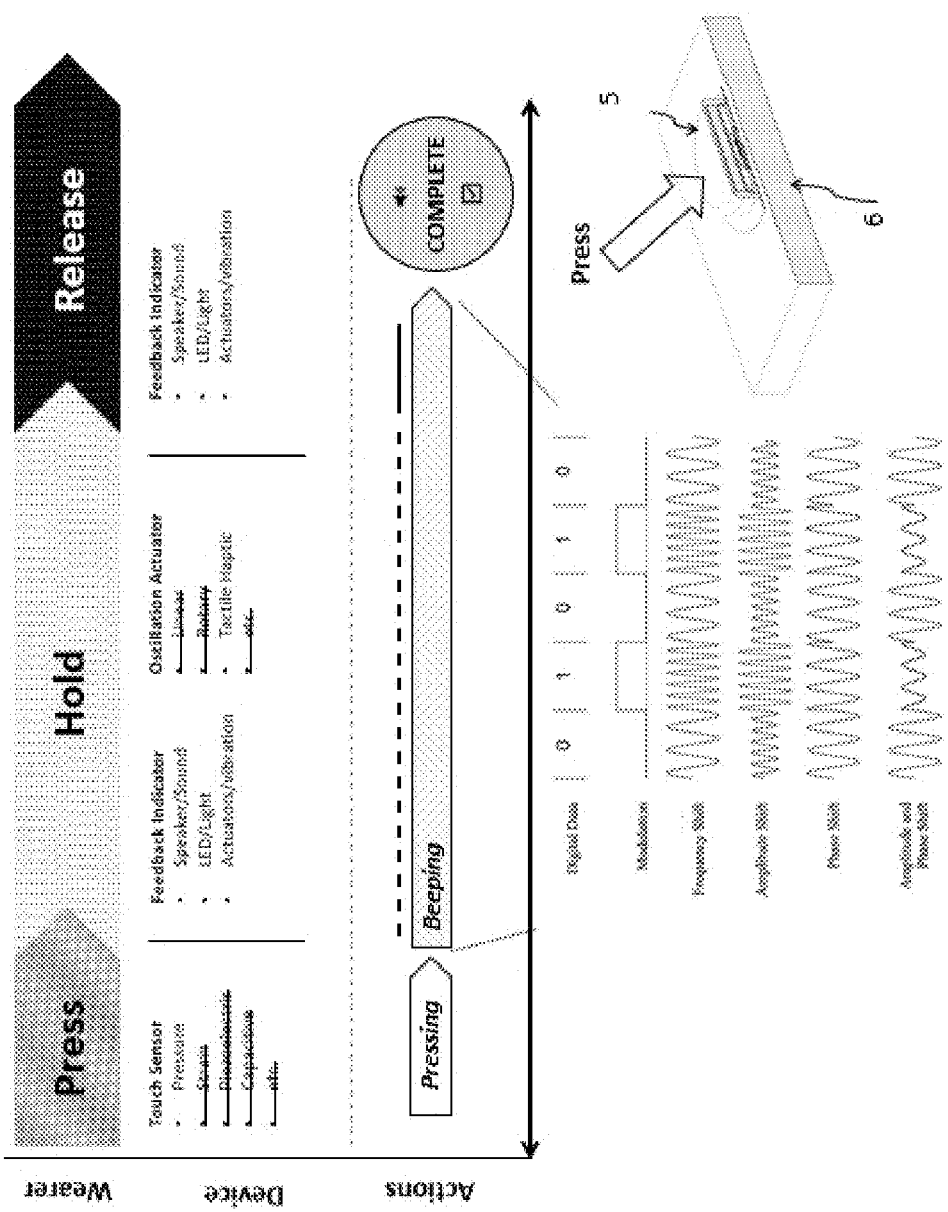
FIG. 5 is a diagram of the skin-insertion force reduction aspect of the system, showing a basic mode of press/hold/release phases with the corresponding exemplary graph of the pressure sensor duration the magnitude and duration of the applied force.

The force touch sensor and vibration actuator, the interplay between the devices, and an operation mode for user interaction can be used in various ways. The following describes an embodiment of the operation mode for this device. The sensor can be a two-component resistance-based pressure sensor with one component placed behind the microneedle array and another on the PCB (as in FIG. 1*a*), and a tactile haptic-based oscillation/resonance actuator in a PCB-mounted resonance-utilizing vibration device electrically connected to the PCB. The oscillation/resistance actuator is selected from the group consisting of linear, rotary and tactile haptic. The user applies the sensor on her skin and presses the back end of the device with the microneedle tips facing the skin. Upon applying the pressure, the actuator begins to resonate with a predefined frequency, magnitude and modulation appropriate for low-force insertion of the microneedle tips through the skin. FIG. 5 depicts a skin-insertion force reduction aspect of the system, with the diagram showing a basic mode of press/hold/release phases with the corresponding exemplary graph of the pressure sensor duration the magnitude and duration of the applied force. Crossed-out text indicates other modules which can be activated and be operational simultaneously, or individually in the above embodiment.

Figure 6:
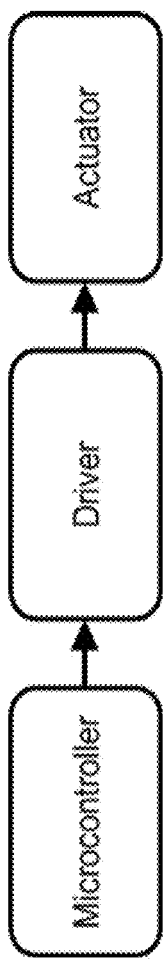
FIG. 6 is a functional block diagram of the vibration actuator control system.

A functional block diagram of the vibration actuator control system is depicted in FIG. 6. It comprises a microcontroller, an actuator driver, and an actuator that produces vibration of the device.

Vibration actuators are selected from the group consisting of an eccentric rotating mass actuator (ERM), a linear resonant actuator (LRA), a piezoelectric actuator, electroactive polymers (EAPs), microelectromechanical systems (MEMS), a tactile haptic-based oscillation/resonance actuator and a voice coil actuator.

The actuator driver outputs a signal whose fundamental frequency is within the operational range of the actuator to cause the vibratory motion of the actuator. The actuator driver, in part, provides amplification to its input signal (from the microcontroller) to provide sufficient current and voltage to cause the actuator to vibrate at the desired magnitude. The actuator driver circuitry may include filtering or employ waveform engineering (e.g., leveraging non-linear characteristics of active components) to produce the desired signal at the actuator's input.

Figure 7:
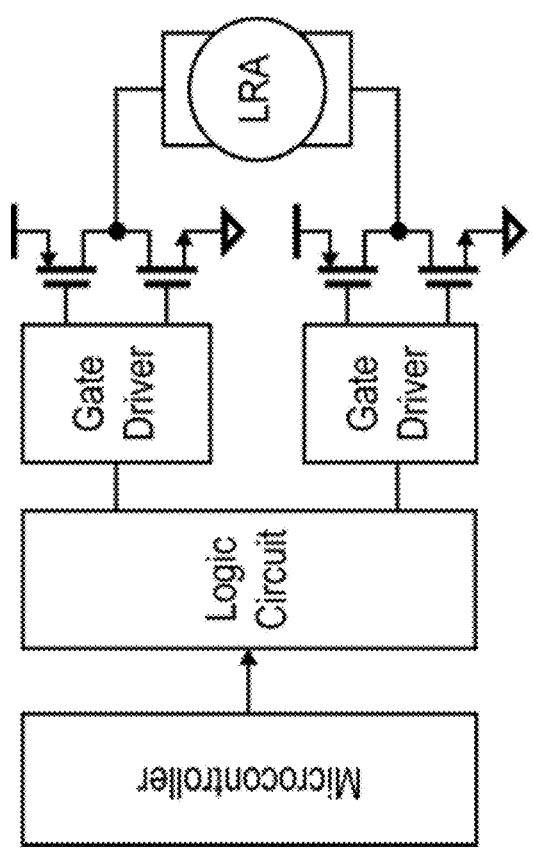
FIG. 7 is an example circuit implementation of the vibration actuator control system.

An example circuit implementation of the vibration actuator control system is depicted in FIG. 7. In one embodiment, the vibration actuator is implemented with a linear resonant actuator (LRA), and the actuator driver is implemented with a class D amplifier which comprises a logic circuit, gate drivers, and output transistors and which operates via pulse-width-modulation (PWM). The microcontroller communicates with the logic circuit (over a digital bus) the desired amplitude of the driver output signal. The logic circuit creates a corresponding PWM signal applied to the switching transistors via gate drivers to ultimately drive the LRA at the desired amplitude at the actuator's resonant frequency.

Figure 8:
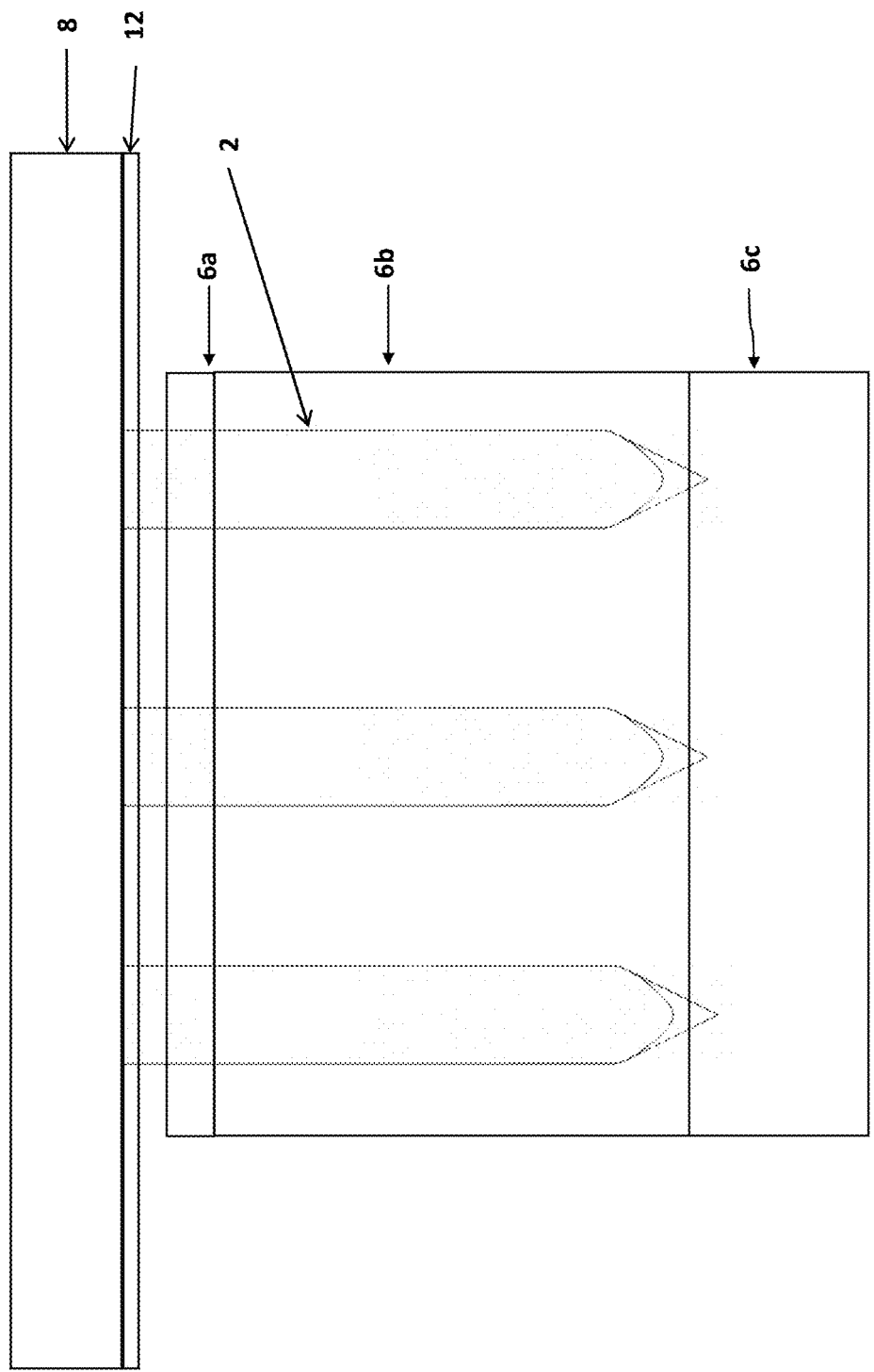
FIG. 8 is a schematic diagram of the microneedle tips placed at the border between the epidermis and the dermis layers of the skin.

Bioelectronic measurement by the microneedle array in combination with the electronics unit also enables verification that the microneedles are properly placed initially and throughout the life of the wearable biosensor device. This protects from excessive or insufficient force during initial placement, and also provides data for notification to the wearer continuously during the life of the device. Microneedles enable accurate biomolecular monitoring by providing continuous access to the ISF beneath the epidermis, whose biomolecular concentration and temporal profiles closely match those of blood. To access and be immersed in ISF, the microneedles must pierce through the outermost layer of the skin, the stratum corneum (~20 μm thickness), and become embedded in the viable epidermis and dermis (~200 μm and ~2 mm thickness, respectively). This is depicted in FIG. 8. It is only after the microneedles are immersed in ISF that accurate biomolecular monitoring occurs. FIG. 8 is a section view of the microneedle array with the microneedles piercing the skin to reach to the border of the dermis and epidermis. This arrangement enables a placement validation system utilizes a bio-electronic measurement in communication with a feedback indicator. The placement validation system informs the user through the feedback indicator when the microneedles have successfully (or unsuccessfully) been embedded into the epidermis (beneath the stratum corneum) and immersed in ISF to facilitate accurate biomolecular monitoring. The feedback indicator, in various forms further described herein, is selected from the group consisting of a vibration actuator, a sound, and/or a flashing light that originate from the device, or a notification through Bluetooth or similar signals to an app on a mobile device of the wearer, which are delivered in response to real-time bioelectronic measurements taken through the tips of the microneedles. Details about the system and the device which implements the system follow.

The bioelectronic measurement system includes the microneedle array described herein which is electrically interfaced with the electronics unit, in one embodiment a PCB. It can be a single or multiplexed two-, three-, or four-electrode electrochemical system utilizing microneedles as electrodes.

The two microneedle electrode configuration is a working electrode (WE) vs. reference electrode combined with counter electrode (RE/CE), and the three microneedle electrode system is configured as WE vs. CE vs. RE. A four-electrode system is configured as working sense electrode (WSE) vs. WE vs. CE vs. RE.

The validation placement system can use electrochemical measurement techniques selected from the group consisting of impedance spectroscopy, potentiometry, voltammetry, and amperometry.

The feedback indicator is integrated into the microneedle sensor device and connected to the PCB. Embodiments of the feedback indicator include a microelectromechanical system (MEMS) speaker, an electrical actuator, and an LED.

Figure 9:
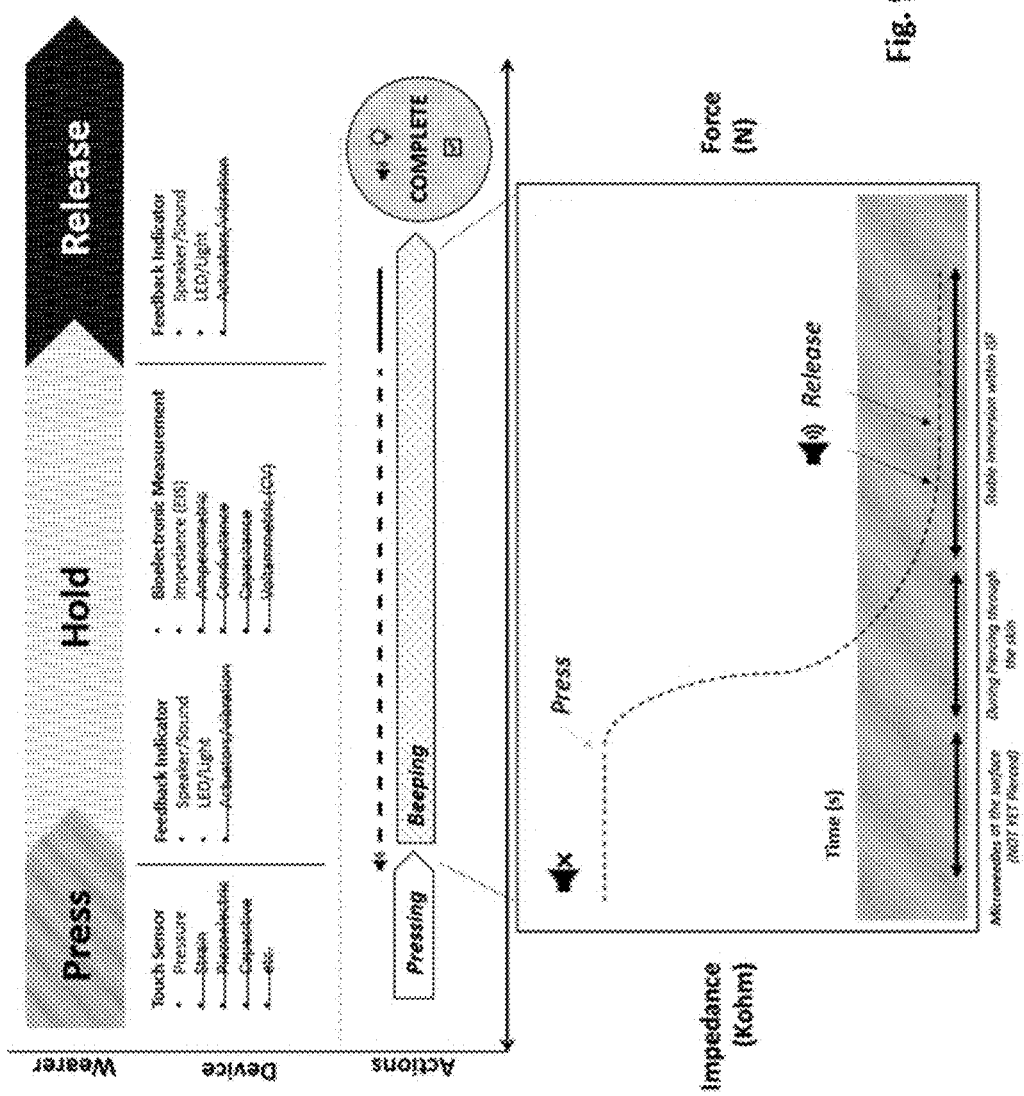
FIG. 9 depicts impedance vs. applied force curve for microneedle electrodes for three phases during insertion through the dermis to the epidermis.

The bioelectronic measurement system and feedback indicator devices, the interplay between the devices, and the operation mode can be realized in various ways. The following describes an embodiment of the operation mode for the feedback and implementation in the device: the placement validation system uses the bioelectronic measurement to perform real-time impedance measurement among electrodes in real-time upon applying a particular magnitude of force on the back side of the sensor device with the microneedle tips facing the skin. As force is applied to the device the pressure sensor, acting as a switch, triggers a start of the impedance measurement and, due to the conductivity shift from the surface of the skin to the dermis soaked with interstitial fluid, the impedance measured among the electrodes will change (i.e., a much larger impedance measured at the microneedle contact with the dermis with less fluid content; and a much lower impedance at the microneedle immersed in the ISF). FIG. 9 illustrates the trend of this change—impedance decreases as applied force increases.

The impedance drops suddenly once the microneedle electrodes have reached ISF. The impedance is monitored by the bioelectronic measuring system in real time to identify when this drop occurs by comparing the impedance in real-time against a threshold. Once the impedance crosses this threshold, and continues to stay past this threshold during the hold time for a pre-set time, a "release" signal is delivered by the feedback indicator in the form of, for example, a buzzing and/or a green light. The buzzing validates to the user that the microneedle electrodes have accessed ISF. FIG. 9 depicts impedance vs. applied force curve for microneedle electrodes for three phases during insertion through the dermis to the epidermis. Crossed-out text indicates other modules which can be activated and be operational simultaneously or individually in this embodiment.

Figure 10:
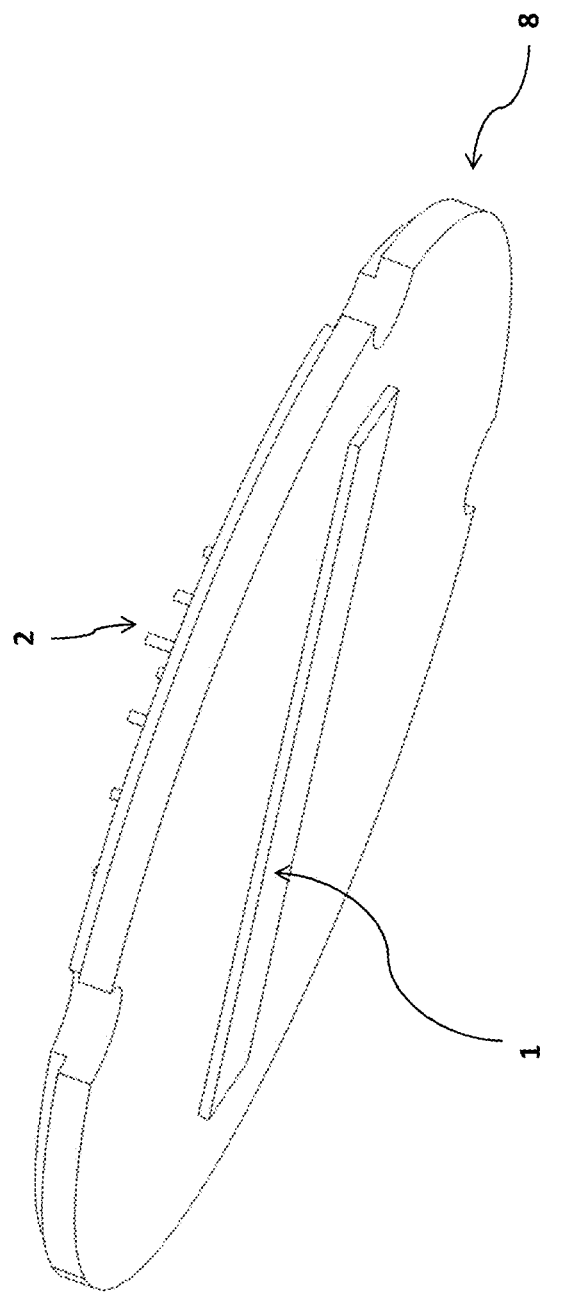
FIG. 10 depicts a strain gauge mounted on the underneath side of the substrate.

FIG. 10 depicts a force touch sensor 4 as a strain gauge mounted on the underneath side of the substrate. Not shown are its electrical connections to the electronics unit 3. In one embodiment, the strain gauge comprises rubber and stretching from force applied is converted into signal processed by the electronics unit.

We claim:

1. A wearable biosensor device comprising
   a microneedle array configured for placement into a biofluid in a user's skin and comprising a substrate with microneedles disposed on the substrate, wherein at least one of the microneedles is configured as a working electrode to detect an electrical signal from a reaction with a target analyte exposed to the microneedle array when contacting the biofluid, wherein the working electrode is functionalized with at least one chemical layer positioned on at least one of the microneedles and configured for producing the electrical signal from the reaction with the target analyte,
   an electronics unit underneath the substrate connected to the microneedles by a plurality of electrical interconnections,
   a force touch sensor configured to measure force applied during placement of the microneedle array and during use, the force touch sensor connected electrically to the electronics unit,
   a placement validation system connected electrically to the electronics unit and configured to detect a change in conditions using bioelectronic measurement among the microneedles when outside the body and during use in the biofluid, and
   a feedback indicator connected electrically to the electronics unit and configured to provide to the wearer a notification of excessive or insufficient force in placement and/or of proper placement in the biofluid.

2. The wearable biosensor device of claim 1, wherein the electronics unit comprises a data processing unit in communication with a signal processing circuit, the data processing unit comprising a processor and a memory and configured to process the electrical signal as data representative of one or more parameters of the target analyte.

3. The wearable biosensor device of claim 2, wherein the signal processing circuit is configured to process the electrical signal by one or more of amplifying the electrical signal, filtering the electrical signal, or converting the electrical signal from analog to digital, and wherein the data processing unit is configured to process the electrical signal after processing by the signal processing circuit.

4. The wearable biosensor device of claim 2, wherein the electronics unit further comprises a wireless communication unit in communication with one or both of the signal processing circuit and the data processing unit, the wireless communication unit comprising a wireless transmitter or wireless transceiver to at least transmit one or both of the electrical signal and the data to an external computing device.

5. The wearable biosensor device of claim 1 wherein the force touch sensor is selected from the group consisting of pressure, strain gauge, piezoresistive, resonant, electromagnetic, capacitive, and diaphragm based MEMS sensors operating individually or in combination with each other.

6. The wearable biosensor device of claim 5 wherein the force touch sensor is configured to transduce an applied force into an electrical parameter selected from the group consisting of resistance, current, capacitance, inductance, frequency or phase shift, voltage variability, optical or thermal changes and magnetic field variations.

7. The wearable biosensor device of claim 1 wherein the placement validation system comprises a single or multiplexed two-, three- or four-electrode electrochemical system comprising the microneedles.

8. The wearable biosensor device of claim 1 wherein the wearable biosensor device is configured to use electrochemical techniques selected from the group consisting of impedance spectroscopy, voltammetry, potentiometry and/or amperometry in order to detect the change in conditions for the bioelectronic measurement.

9. The wearable biosensor device of claim 1 wherein the feedback indicator comprises a physical or virtual device configured to generate the notification selected from the group consisting of a microelectromechanical system (MEMS) speaker, a vibration actuator, and a light-emitting diode (LED) on the wearable device and a Bluetooth or similar notification to a mobile device containing an app.

10. The wearable biosensor device of claim 9 wherein the vibration actuator is selected from the group consisting of an eccentric rotating mass actuator (ERM), a linear resonant actuator (LRA), a piezoelectric actuator, electroactive polymers (EAPs), microelectromechanical systems (MEMS), a tactile haptic-based oscillation/resonance actuator and a voice coil actuator.

11. The wearable biosensor device of claim 9 wherein a driving signal of the vibration actuator is selected from the group consisting of amplitude, frequency and on/off keying.

12. The wearable biosensor device of claim 9 wherein the notification is selected from the group of a sound, a light, a vibration or a message delivered to the app on the mobile device.

13. The wearable biosensor device of claim 1 wherein the force touch sensor is also configured as a switch to turn the wearable biosensor device on or off.

14. The wearable biosensor device of claim 1 wherein the microneedle array comprises a nonconductive polymer coated with an electrically conductive layer and positioned underneath the chemical layer.

15. The wearable biosensor device of claim 1 wherein the microneedle array comprises a semiconductor material having various material layers applied and shaped using microelectromechanical systems (MEMS).

16. The wearable biosensor device of claim 1 wherein the microneedles are separated into groups which are electrically segregated, and the at least one chemical layer for each of the groups is different for a unique analyte.

17. The wearable biosensor device of claim 1, wherein the at least one chemical layer comprises a material selected from the group consisting of an enzyme, an ionophore, an antibody, a peptide nucleic acid (PNA), a DNA aptamer, a RNA aptamer, a molecularly imprinted polymer (MIP), and a cell.

* * * * *